(12) United States Patent
Aritome

(10) Patent No.: US 7,403,425 B2
(45) Date of Patent: Jul. 22, 2008

(54) PROGRAMMING A FLASH MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 315 days.

(21) Appl. No.: 11/369,347

(22) Filed: Mar. 7, 2006

(65) Prior Publication Data

US 2007/0211536 A1 Sep. 13, 2007

(51) Int. Cl.
 *G11C 11/03* (2006.01)
(52) U.S. Cl. .................. 365/185.22; 365/185.17; 365/185.33
(58) Field of Classification Search ............ 365/185.22, 365/185.17, 185.33
See application file for complete search history.

(56) References Cited

U.S. PATENT DOCUMENTS

| 6,240,018 | B1 | 5/2001 | Miyamoto et al. | |
|---|---|---|---|---|
| 6,490,201 | B2 | 12/2002 | Sakamoto | |
| 6,498,752 | B1 | 12/2002 | Hsu et al. | |
| 6,950,344 | B1 | 9/2005 | Fastow et al. | |
| 6,996,004 | B1 | 2/2006 | Fastow et al. | |
| 6,999,345 | B1 * | 2/2006 | Park et al. | 365/185.18 |
| 7,020,017 | B2 | 3/2006 | Chen et al. | |
| 7,062,599 | B2 | 6/2006 | Pistilli | |
| 7,151,694 | B2 * | 12/2006 | Meihong et al. | 365/185.22 |

\* cited by examiner

*Primary Examiner*—Pho M. Luu
(74) *Attorney, Agent, or Firm*—Leffert Jay & Polglaze, P.A.

(57) ABSTRACT

An initial verify read operation is performed after each programming pulse. The verify voltage starts at an initial verify voltage for the first word line and increases for each word line that is verified up to a maximum verify voltage. A second verify read operation is then performed after the program/verify operation. The second verify read operation uses a verify voltage that is substantially close to the maximum verify voltage used during the program/verify step.

29 Claims, 11 Drawing Sheets

PROGRAMMING A FLASH MEMORY DEVICE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

FIG. 1 illustrates a simplified diagram of a typical prior art NAND flash memory array. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

A selected word line 100 for the flash memory cells 130-131 being programmed is typically biased by programming pulses that start at a voltage of around 16V and may incrementally increase to more than 20V. The unselected word lines for the remaining cells are typically biased at $V_{pass}$. This is typically in an approximate range of 9-10V. The bit lines of the cells to be programmed are typically biased at 0V while the inhibited bit lines are typically biased at $V_{CC}$.

As NAND flash memory is scaled, parasitic capacitance coupling between adjacent memory cell floating gates becomes a problem. Because of the capacitive coupling, the cells that are adjacent to a cell storing a charge are prone to having their threshold voltages ($V_t$) raised. If the adjacent cells have their threshold voltages raised too high, an unprogrammed cell might appear as being programmed.

Additional NAND memory array problems are series string resistance issues and source resistance issues. String resistance increases from a programmed cell in the same string. This reduces the cell current and increases $V_t$ for unprogrammed cells.

Similarly, increased source resistance creates a higher voltage drop per cell at the source wiring. Cell current is reduced and $V_t$ is increased for unprogrammed cells.

These problems are illustrated in FIG. 6 that shows a memory programming method with the resulting floating gate-to-floating gate interference and the string resistance. This plot shows the $V_t$ shifts for each word line (i.e., WL0-WL31) and a reason for a particular shift. For example, page 3 shows that the $V_t$ shift was caused by floating gate-to-floating gate interference along the bit line as well as the string resistance. The dotted line 601 shows the original $V_t$ and the solid line 602 shows the worst case shifted $V_t$ after all pages have been programmed.

The above-described problems for single level cell (SLC) NAND arrays are even worse in a multiple level cell (MLC) array. MLC memory stores multiple bits on each cell by using different threshold levels for each state that is stored. The difference between adjacent threshold voltage distributions is typically very small as compared to an SLC memory device. Therefore, the effects of the floating gate-to-floating gate coupling in an MLC device are greatly increased.

For the reasons stated above, and for other reasons stated below which will become apparent to those skilled in the art upon reading and understanding the present specification, there is a need in the art for a way to minimize the effects of coupling, string resistance, and source resistance in a memory device.

SUMMARY

The above-mentioned problems in a memory device and other problems are addressed by the present invention and will be understood by reading and studying the following specification.

The embodiments of the present invention encompass a method for programming a non-volatile memory array that has a plurality of memory cells. The method comprises performing a first plurality of verify operations on the memory array. Each verify operation of the plurality of verify operations comprises a verify bias voltage that is greater than a previous verify bias voltage. The plurality of verify bias voltages have a maximum verify bias voltage. A subsequent verify operation is performed on the memory array after the first plurality of verify operations. The subsequent verify operation uses a verify voltage bias that is relatively close to the maximum verify voltage used during the first plurality of verify operations.

Further embodiments of the invention include methods and apparatus of varying scope.

DETAILED DESCRIPTION

Figure 1:
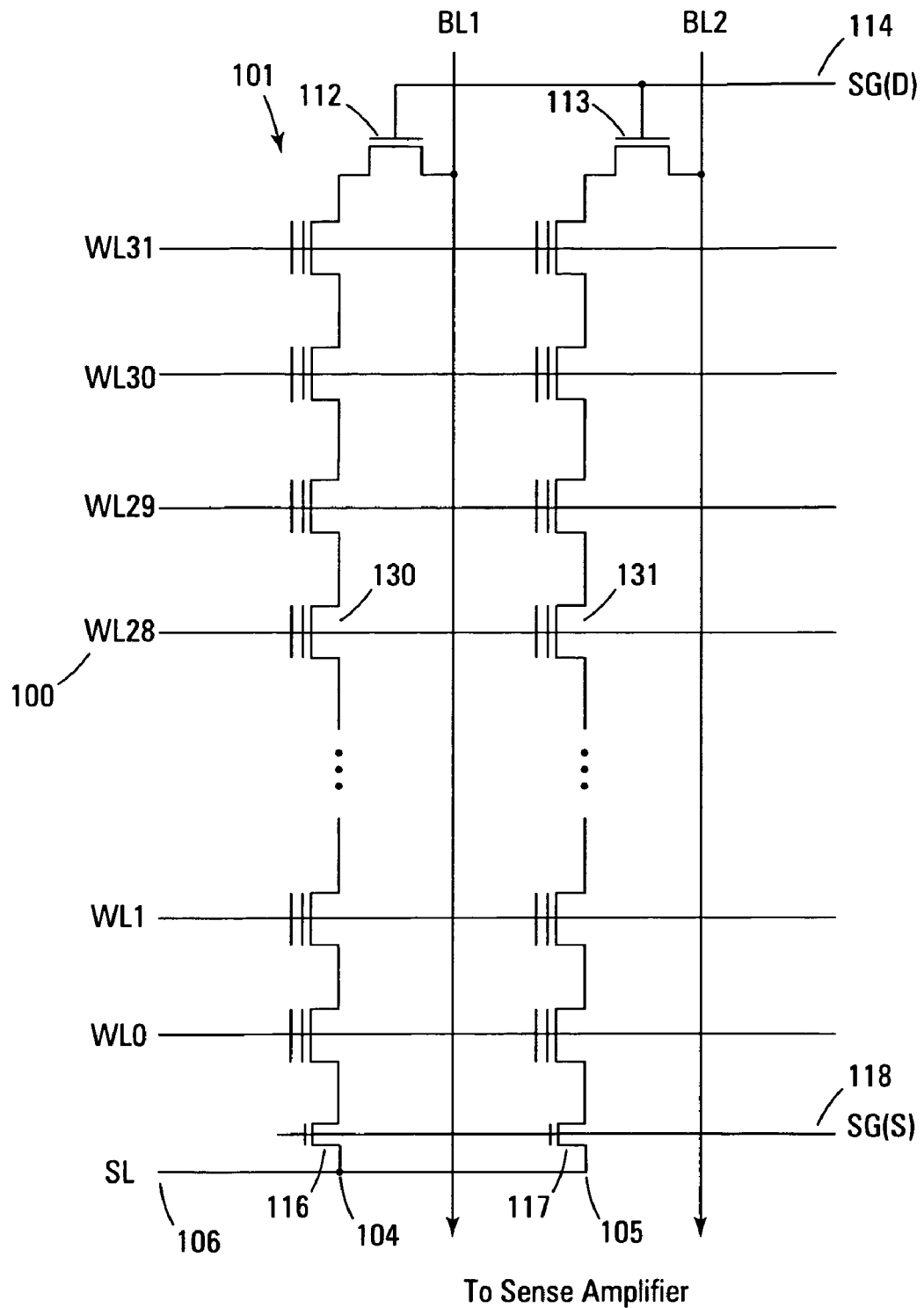
FIG. 1 shows a portion of a typical prior art NAND architecture flash memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
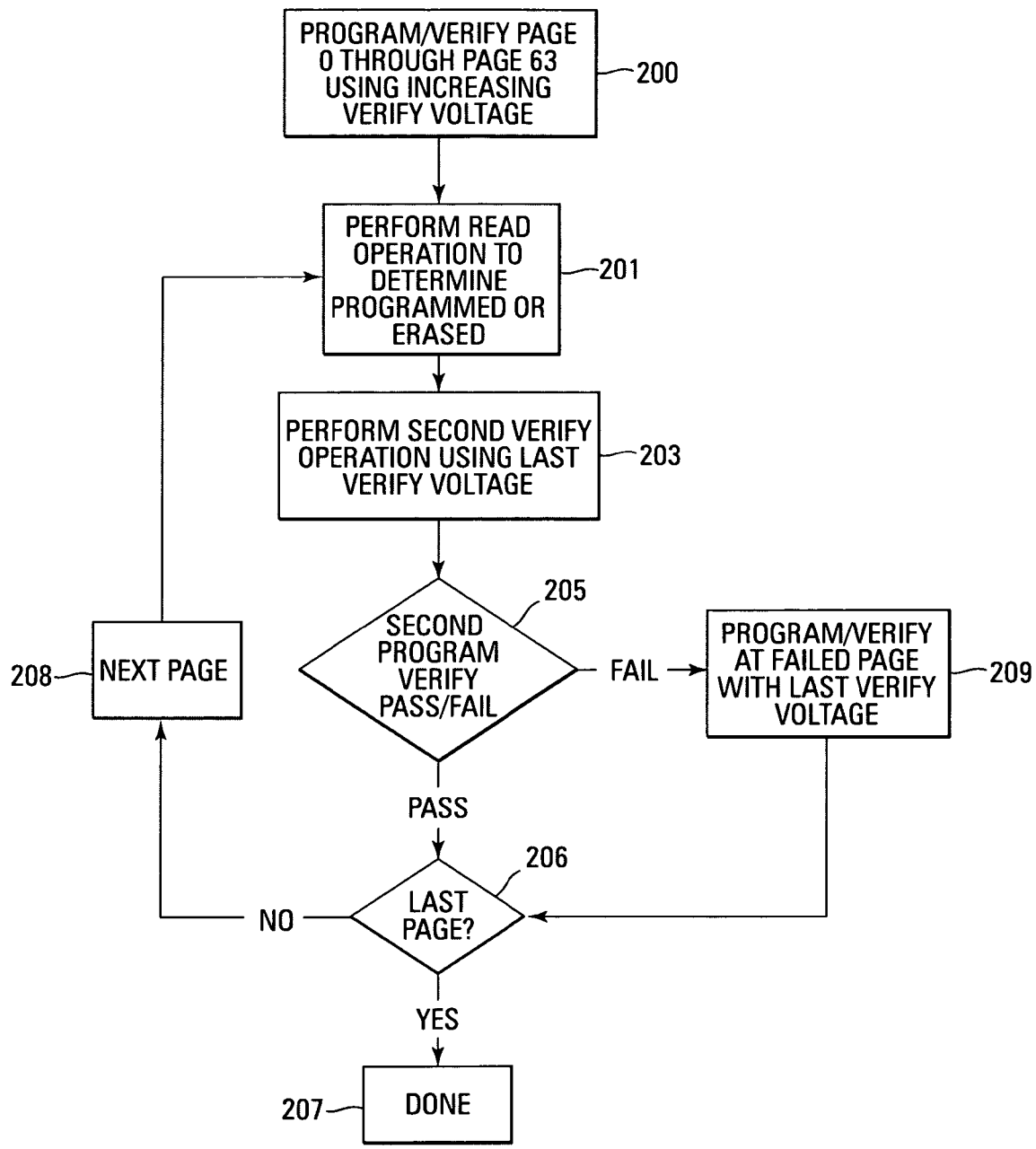
FIG. 2 shows a flowchart of one embodiment of a memory programming method of the present invention.

FIG. 2 illustrates a flowchart of one embodiment of a method for programming a NAND memory array. This method is comprised of initially performing a program/verify operation on select cells on word lines starting at the initial word line (e.g., WL0) and increasing to the final word line (e.g., WL31) 200. The subsequently described embodiments of the present invention assume that WL0 is the closest word line to the source line and WL31 is the furthest word line from the source line. However, alternate labeling conventions may reverse this.

As is well known in the art, a flash memory cell is programmed by a series of incrementally increasing voltage pulses on the selected word line. The pulses typically start at an initial voltage (e.g., 16V) and increase by a set amount (e.g., 1V) until the desired cells are either programmed or an error occurs due to the cell or cells not being programmable. The present invention is not limited to any one method for programming the cells.

As part of each program operation, a read verify is performed on each cell after each programming pulse in order to determine whether each cell has been properly programmed. The read verify operation is comprised of biasing the selected word line containing the cell to be verified with a verify voltage.

The present invention starts with an initial, lower verify voltage for the first word line programmed and increments with a step voltage to a final verify voltage that is used for the final word line programmed. In one embodiment, the initial verify voltage for the first verify read operation is 0.4V. Alternate embodiments may use other initial voltages.

The step voltage used to increment the verify voltage as the selected word line changes can be determined in various ways. In one embodiment, a step voltage is determined by subtracting the initial verify voltage from the final verify voltage that biases the last selected word line and dividing the result by the quantity of increments required for a given quantity of word lines to be verified. For example, in the illustrated embodiment, the initial verify voltage is 0.4V, the final verify voltage is 1.0V, and the quantity of required increments is 31 (WL0 to WL31). Therefore, the step voltage is $(1.0-0.4)/31=20$ mV.

Another embodiment determines the step voltage by grouping of word lines. For example, the initial verify voltage is 0.4V for WL0-WL4, 0.5V for WL5-WL9, 0.6 for WL10-WL14, 0.7V for WL15-WL19, 0.8V for WL20-WL24, 0.9V for WL25-WL29, and 1.0V for WL30-WL31. Obviously, alternate embbodiments can use different voltages for each group and/or different groupings of word lines for each voltage.

These examples for determining the step voltage are for purposes of illustration only. Alternate embodiments can use other methods of determining how the verify voltage is incremented for each verify operation.

After the programming of the row of cells coupled to WL31 (or the final page) has been accomplished 200, a normal read operation is performed 201 on each cell in order to determine whether a logical zero or a logical one has been programmed into that particular cell. This data is then used in the next step 203 for the second verify operation. In one embodiment, a read voltage in the range of 0-0.4V is used to bias the selected word line during the read operation. Alternate embodiments can use other read voltages.

After the read operation 201, a second verify read operation is performed at the last used verify voltage 203. In one embodiment, this second verify operation voltage is substantially close to the verify voltage used for the last page in the block. For example, this voltage may be in the range of 0.8V to 1.0V. Alternate embodiments may use other verify voltages for the second verify read operation 203.

It is then determined if the second verify read operation passed or failed 205 due to floating gate-to-floating gate coupling (or other programming errors). If the second verify operation failed, a program/verify operation 209 is again performed on the failed page. This operation 209 uses the incrementally increasing programming pulses with the same verify voltage following each programming pulse. The verify voltage bias used is the same voltage level that was used on that particular page during the first set of program/verify operations. The program/verify operation 209 is repeated until the page is verified as programmed or it is determined that a cell on the word line is not programmable.

If the second verify operation passed 205, it is determined if all of the pages have gone through the second verify read operation 206. If all of the pages have not been verified with the second verify read operation, the method increments to the next page 208 and performs the second verify read operation 203. This repeats until all of the programmed pages have gone through the second verify read operation and the method is done 207.

Figure 7:
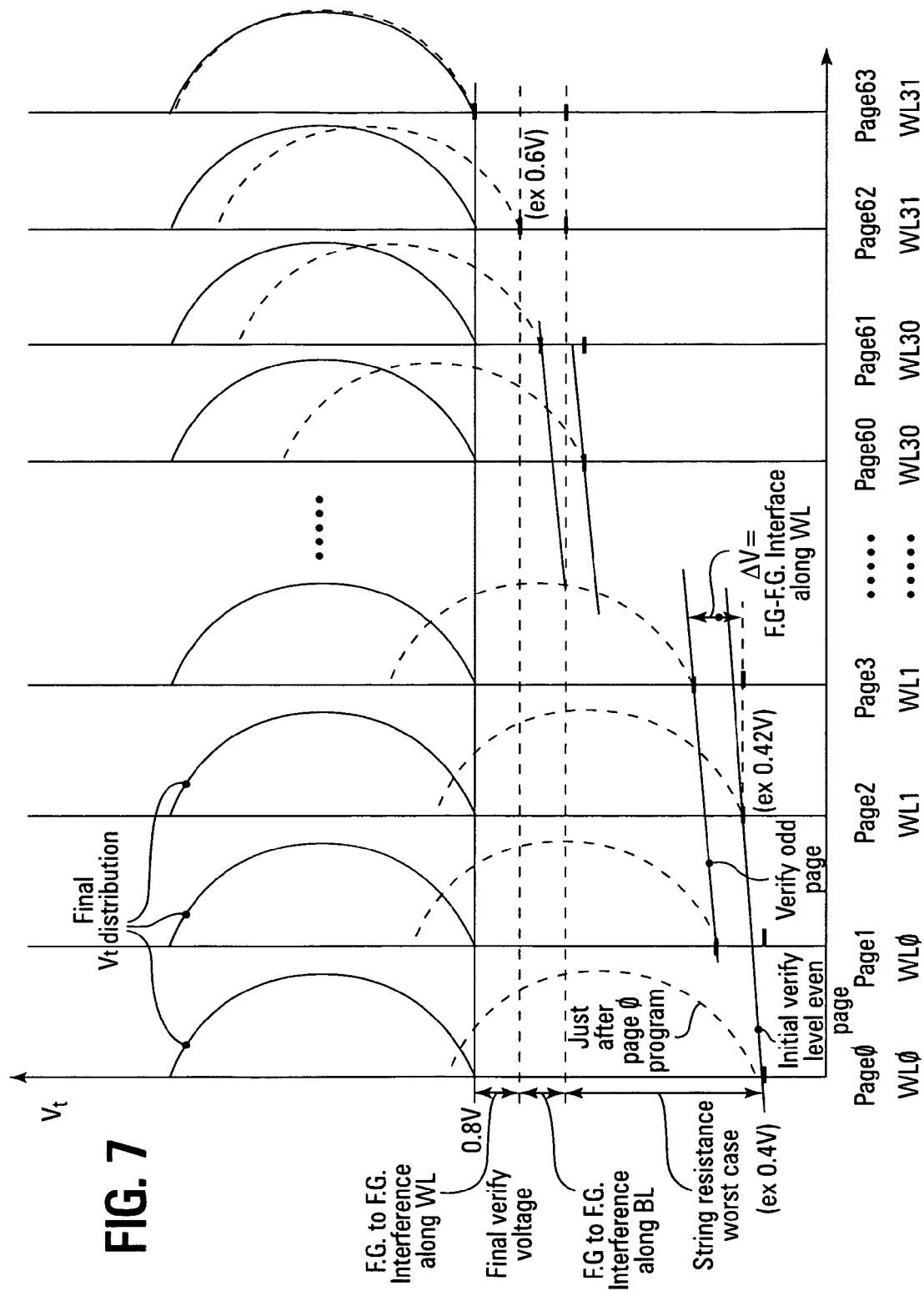
FIG. 7 shows one embodiment of a $V_t$ distribution in accordance with the embodiment of FIG. 2.

FIG. 7 illustrates a $V_t$ distribution resulting from one embodiment of the memory programming method of the present invention. This figure shows the threshold voltage distributions for the 64 pages (i.e., page 0-63) of a memory block.

This diagram shows that page 63 does not experience floating gate-to-floating gate interference or string resistance. Page 62 does not experience string resistance but has floating gate-to-floating gate interference along the word line. In one embodiment, the threshold voltage has shifted to 0.6V. By page 0, the string resistance is worst case. Both the floating gate-to-floating gate interference along the bit lines and along the word lines are shown. There is also a ΔV difference between the verify level for the odd page and the verify level for the even page. This is due to the floating gate-to-floating gate interference along the word line. The illustrated voltages are for purposes of illustration only as alternate embodiments can use other voltages than those shown.

Figure 8:
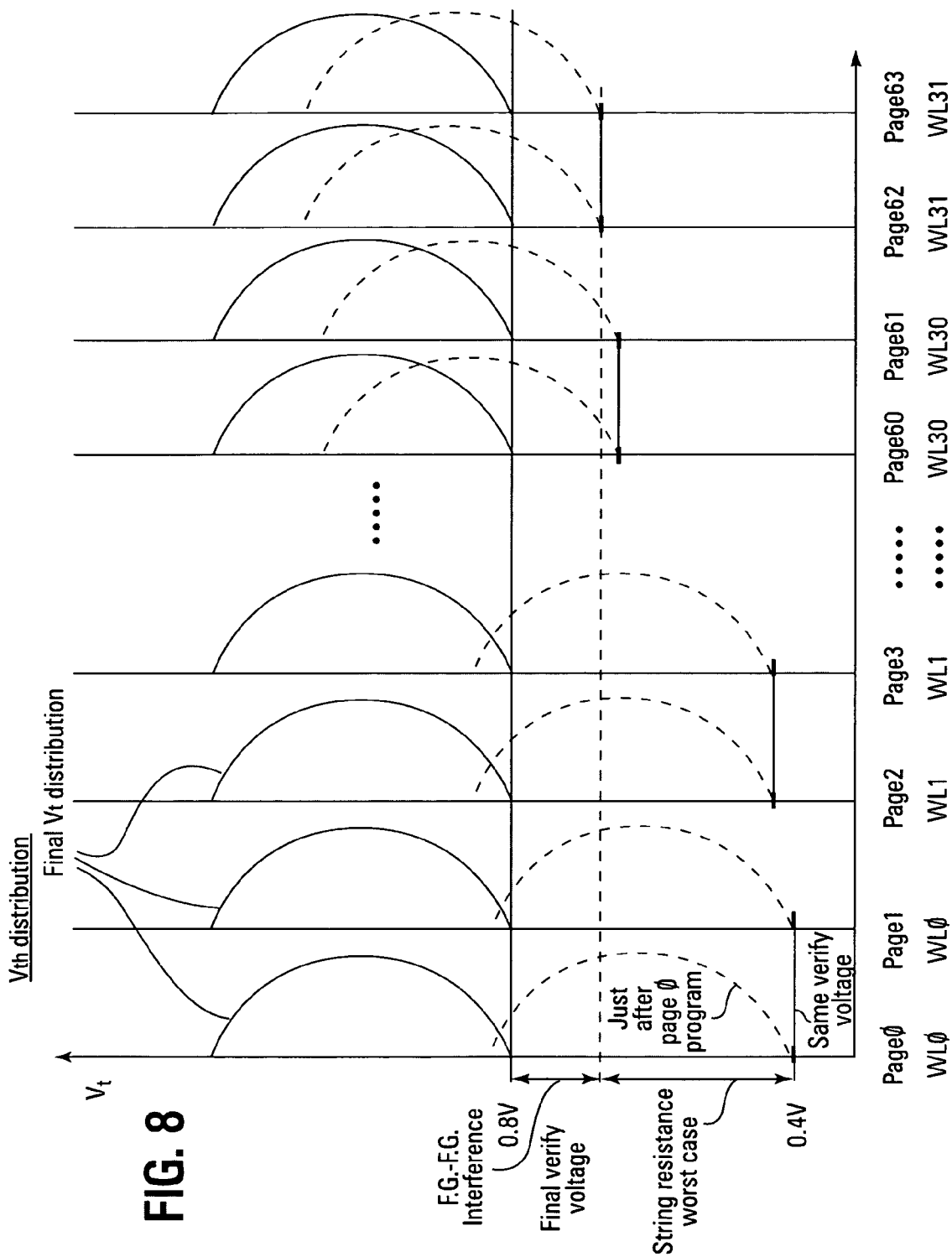
FIG. 8 shows another embodiment of a $V_t$ distribution in accordance with the embodiment of FIG. 2.

FIG. 8 illustrates a $V_t$ distribution resulting from another embodiment of the memory programming method of the present invention. This embodiment shows that the verify voltage levels (e.g., 0.4) are the same for both the odd and the even pages. The illustrated voltages are for purposes of illustration only as alternate embodiments can use other voltages than those shown.

Figure 9:
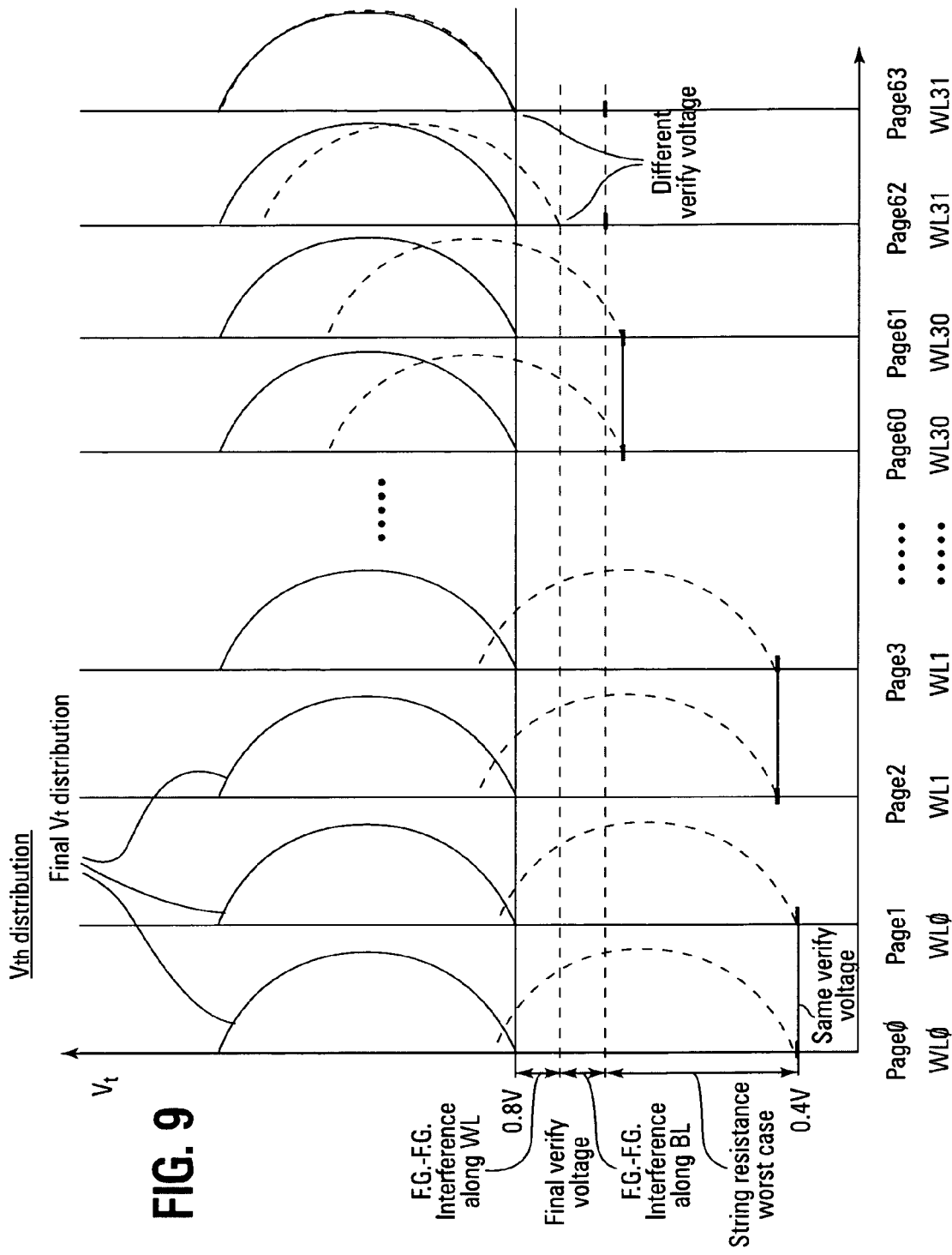
FIG. 9 shows yet another embodiment of a $V_t$ distribution in accordance with the embodiment of FIG. 2.

FIG. 9 illustrates yet another Vt distribution resulting from another embodiment of the memory programming method of the present invention. This embodiment shows that the odd and even page verify voltage levels are the same starting at page 0 but by page 62 and 63, the verify voltages are different. The illustrated voltages are for purposes of illustration only as alternate embodiments can use other voltages than those shown.

Figure 3:
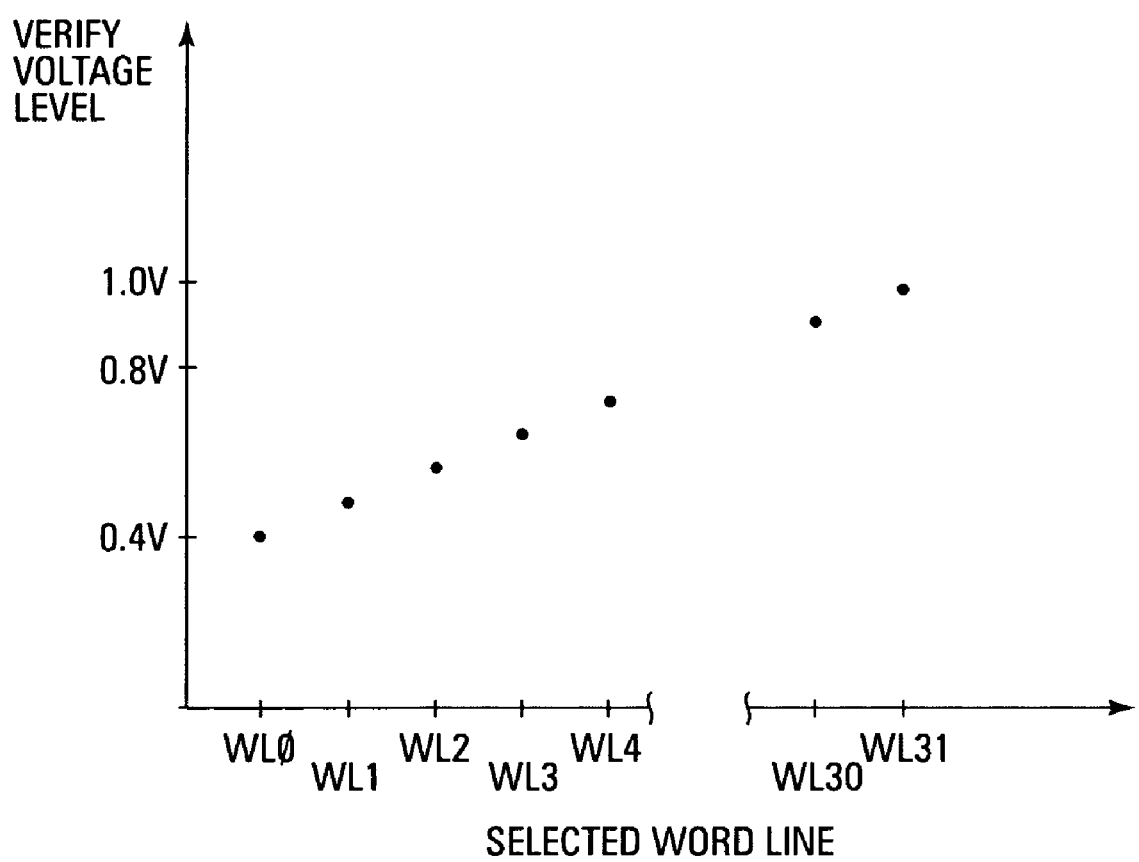
FIG. 3 shows a plot of verify voltage levels versus selected word line in accordance with the method of FIG. 2.

FIG. 3 illustrates a plot of the verify voltage level versus the selected word line. The plot shows that as the selected word line increases from WL0 to WL31, the verify voltage level increases. In one embodiment, the first selected word line WL0 is verified to 0.4V and the last word line WL31 is verified to 1.0V. The voltage levels shown are for purposes of illustration only. The present invention is not limited to any predetermined starting verify voltage, final verify voltage, or any predetermined step voltage.

FIG. 3 assumes that WL0 is closest to the source line and WL31 is the furthest word line from the source line. Alternate embodiments may label the closest word line to the source line as being WL31. In such an embodiment, the horizontal axis of FIG. 3 would be reversed such that the lowest verify voltage starts at selected word line WL31.

Figure 10:
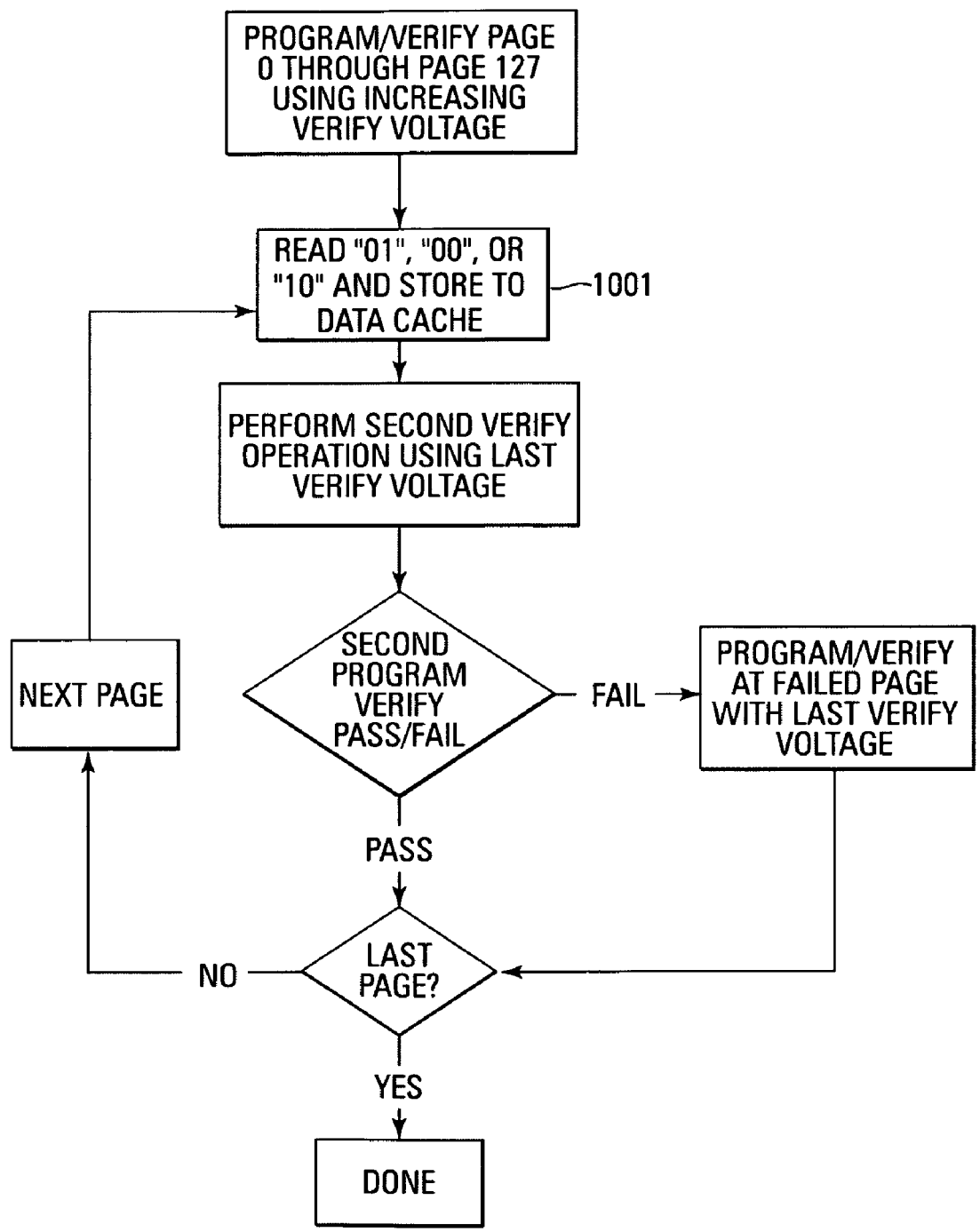
FIG. 10 shows a flow chart of one embodiment of a multiple level cell memory programming method of the present invention.

FIG. 10 illustrates a flow chart of an alternate embodiment of a method of the present invention for programming a memory device. This embodiment programs a multiple level cell (MLC). The method of FIG. 10 is substantially similar as that shown in FIG. 2 and described previously. One difference is that the read operation 1001 reads multiple bits (i.e., "01", "00", or "10") and stores the read data in a data cache.

Figure 11:
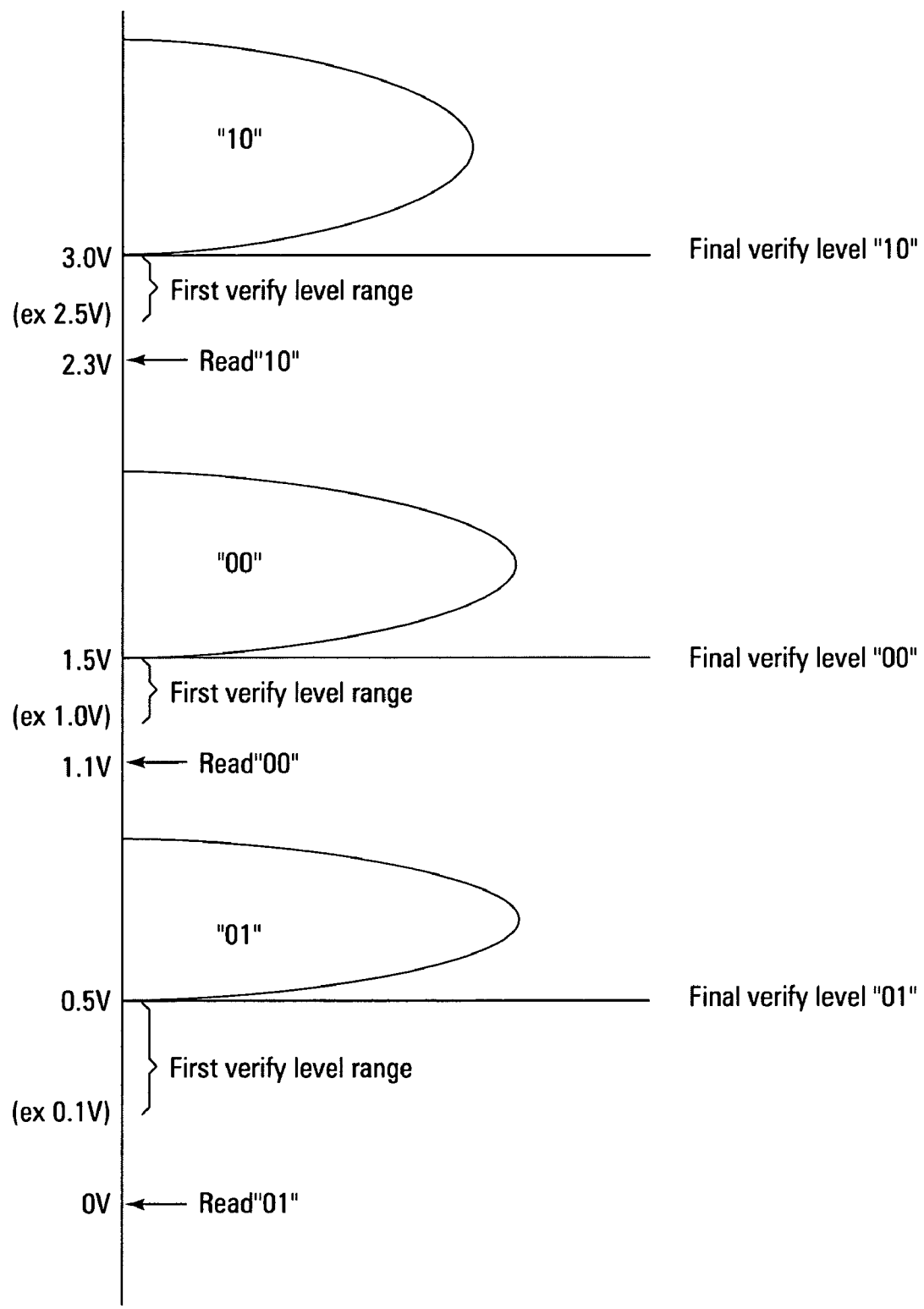
FIG. 11 shows a $V_t$ distribution in accordance with the embodiment of FIG. 10.

FIG. 11 illustrates a $V_t$ distribution in accordance with the multiple level cell programming method of FIG. 10. The figure shows the three possible two-bit states 1101-1103 with state "11" being an erased state that is not shown. The initial read levels for each state 1105-1107 are shown along with the first verify range of voltages 1110-1112. The final verify level for each state is shown as the maximum level of those ranges. The voltages shown are for purposes of illustration only as alternate embodiments may use other voltages.

In an alternate embodiment, not all of the pages of a memory block are programmed. In one embodiment, only half of the pages of a block are programmed. In such an embodiment, the second verify operation is done automatically.

Figure 4:
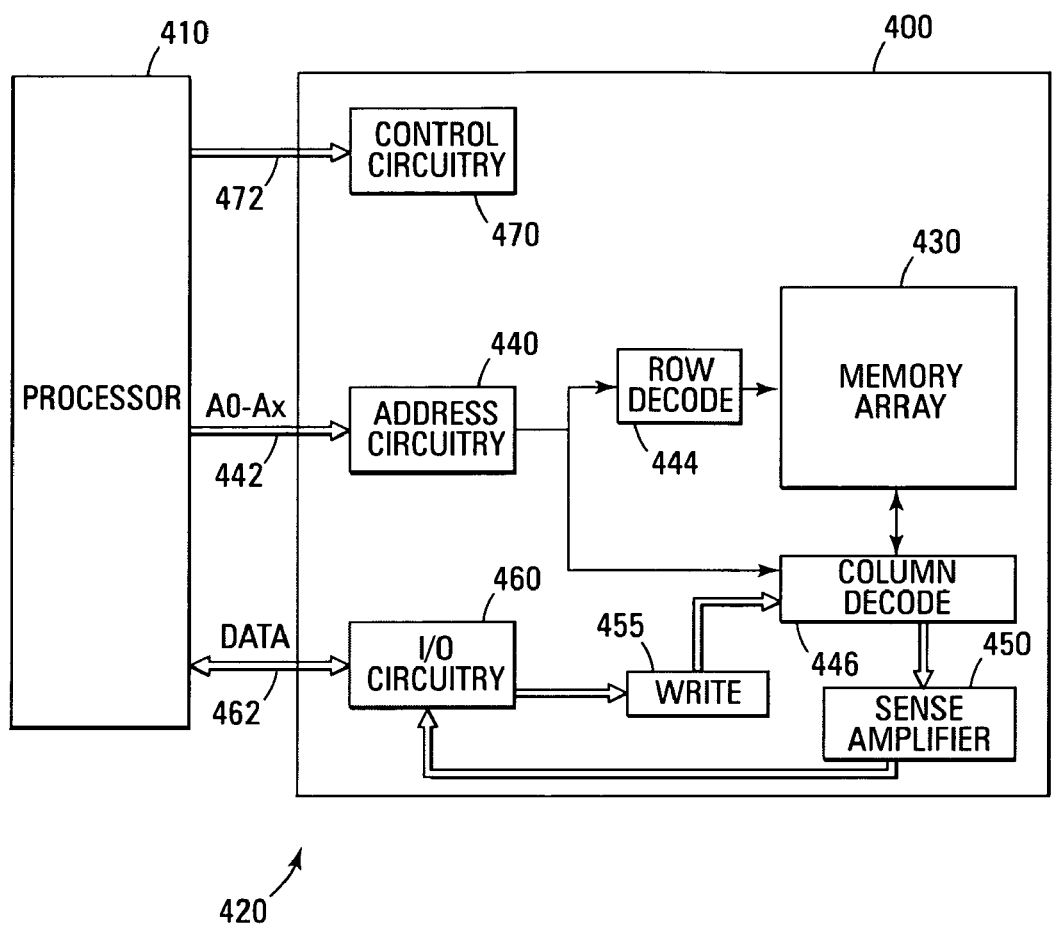
FIG. 4 shows a block diagram for one embodiment of a memory system of the present invention.

FIG. 4 illustrates a functional block diagram of a memory device 400 that can incorporate the non-volatile memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430 or some other type of non-volatile memory cells. The memory array 430 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, an AND architecture, or some other array architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller. The control circuitry 470 of the present invention, in one embodiment, is responsible for executing the embodiments of the programming method of the present invention.

The flash memory device illustrated in FIG. 4 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 5:
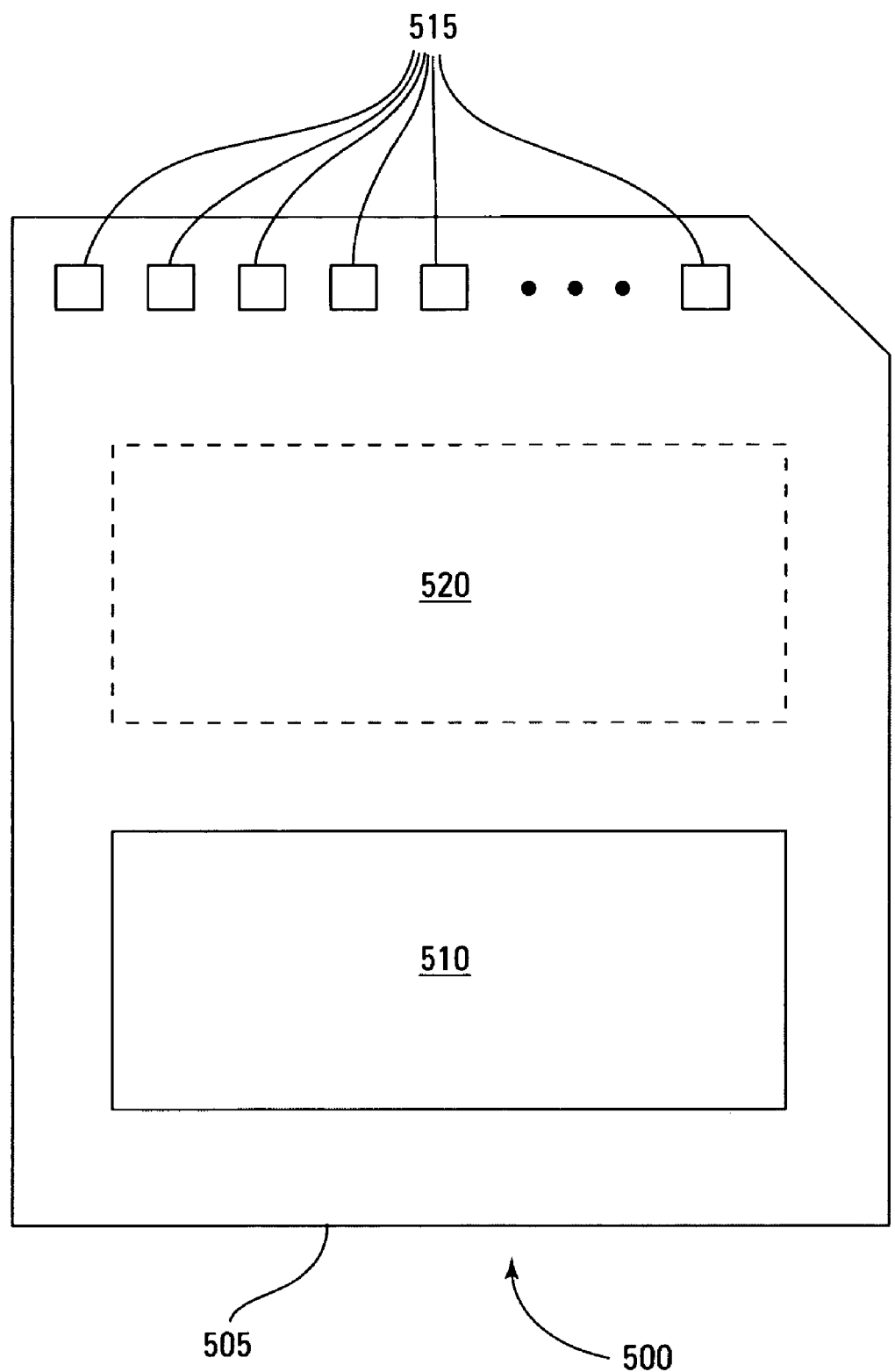
FIG. 5 shows a block diagram for one embodiment of a memory module of the present invention.
Figure 6:
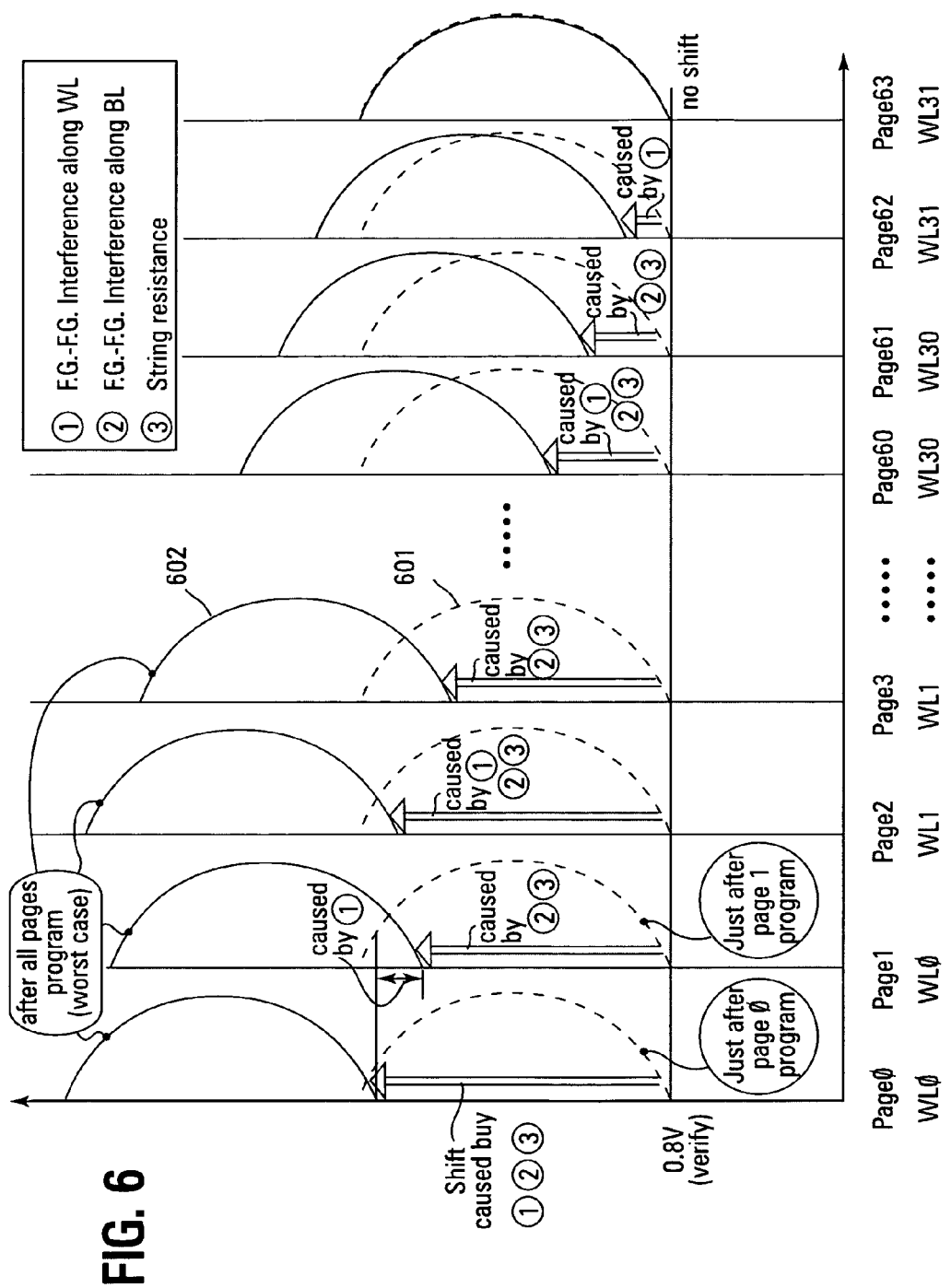
FIG. 6 shows a $V_t$ distribution for a memory programming method with resulting interference.

FIG. 5 is an illustration of a memory module 500 that incorporates the memory cell embodiments as discussed previously. Although memory module 500 is illustrated as a memory card, the concepts discussed with reference to memory module 500 are applicable to other types of removable or portable memory, e.g., USB flash drives. In addition, although one example form factor is depicted in FIG. 5, these concepts are applicable to other form factors as well.

Memory module 500 includes a housing 505 to enclose one or more memory devices 510 of the present invention. The housing 505 includes one or more contacts 515 for communication with a host device. Examples of host devices include digital cameras, digital recording and playback devices, PDAs, personal computers, memory card readers, interface hubs and the like. For some embodiment, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 515 provide an interface for passing control, address and/or data signals between the memory module 500 and a host having compatible receptors for the contacts 515.

The memory module 500 may optionally include additional circuitry 520. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510. The additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

In summary, the embodiments of the present invention provide a way to reduce or eliminate floating gate-to-floating gate effects, string resistance, and source line resistance. This is accomplished by performing an initial verify read operation after each programming pulse that uses a verify voltage that increases for each word line that is verified. A second verify read operation is then performed after the program/verify operation. The second verify read operation uses a verify voltage that is substantially close to the last verify voltage used during the program/verify step.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a non-volatile memory array having a plurality of memory cells, the method comprising:
    performing a first plurality of verify operations on the memory array wherein each verify operation of the plurality of verify operations comprises a verify bias voltage that is greater than a previous verify bias voltage, the plurality of verify bias voltages having a maximum verify bias voltage; and
    performing a second plurality of verify operations on the memory array after the first plurality of verify operations.

2. The method of claim 1 wherein each of the second plurality of verify operations uses a verify bias voltage that is substantially close to the maximum verify bias voltage.

3. The method of claim 2 wherein the verify bias voltage of the second plurality of verify operations is in a range of 0.8V to 1.0V.

4. The method of claim 1 wherein each of the first plurality of verify operations are part of a programming operation.

5. The method of claim 4 wherein each programming operation comprises at least one programming pulse biasing a memory cell, each programming pulse followed by a verify operation that includes a first verify bias voltage.

6. The method of claim 1 wherein the plurality of verify bias voltages are in a range of 0.4V to 1.0V.

7. A method for programming a flash memory array having a plurality of memory cells arranged in columns and rows, each row coupled by a different word line of a plurality of word lines, the method comprising:
    performing a program/verify operation on the plurality of word lines wherein each program/verify operation biases a word line with a verify voltage that is greater than a previous verify voltage until a maximum verify voltage is reached; and
    performing a second verify operation on each of the programmed/verified word lines wherein each second verify operation biases a word line with a voltage substantially equal to the maximum verify voltage.

8. The method of claim 7 and further including performing a read operation prior to performing the second verify operation.

9. The method of claim 7 and further including performing additional program/verify operations on any word lines not verified as being programmed until the word lines not verified are either programmed or determined to be not programmable.

10. A method for programming a flash memory array having a plurality of memory cells arranged in columns and rows, each row coupled by a different word line of a plurality of word lines such that a first word line is closest to a source line and a last word line is furthest from the source line, the method comprising:
    performing a program/verify operation on each of the plurality of word lines starting at the first word line and incrementing through the plurality of word lines to the last word line, wherein each program/verify operation biases a word line with a verify voltage that is incremented from a previous verify voltage by a step voltage until a maximum verify voltage is reached;
    performing a read operation on the cells coupled to each word line to obtain read data; and performing a verify operation on the plurality of word lines using the read data wherein each verify operation biases a word line with a voltage substantially equal to the maximum verify voltage.

11. The method of claim 10 and further including determining the step voltage by subtracting an initial verify voltage from the maximum verify voltage and dividing the difference by a quantity of step voltages required to go from the initial verify voltage to the maximum verify voltage.

12. The method of claim 10 and further including determining the step voltage by grouping predetermined sets of word lines of the plurality of word lines such that each word line of a set is verified with the same verify voltage that is different than other verify voltages of the remaining sets.

13. A flash memory device comprising:
a memory array comprising a plurality of cells organized in rows and columns wherein each row of cells is coupled to a different word line, the array having a source line and a drain line; and
control circuitry coupled to the memory array and adapted to control operation of the memory device, the control circuitry adapted to program the memory array by performing a first plurality of verify operations on the memory array wherein each verify operation of the first plurality of verify operations comprises a verify bias voltage that is greater than a previous verify bias voltage of the first plurality of verify operations, the plurality of verify bias voltages having a maximum verify bias voltage, and performing a second plurality of verify operations on the memory array after the first plurality of verify operations.

14. The device of claim 13 wherein the control circuitry is further adapted to begin the first plurality of verify operations at a word line that is closest to the source line and end at the word line closest to the drain line such that the verify bias voltage starts at an initial voltage and is incremented by a step voltage to the maximum verify bias voltage as the control circuitry increments through the word lines from lowest to highest.

15. The device of claim 13 wherein the memory array is a flash memory array having a NAND architecture.

16. A memory system comprising:
a processor that generates memory signals; and
a non-volatile memory device comprising:
a memory array comprising a plurality of cells organized in rows and columns wherein each row of cells is coupled to a different word line, the array having a source line and a drain line; and
control circuitry coupled to the memory array and adapted to control operation of the memory device, the control circuitry adapted to program the memory array by performing a first plurality of verify operations on the memory array wherein each verify operation of the first plurality of verify operations comprises a verify bias voltage that is greater than a previous verify bias voltage of the first plurality of verify operations, the plurality of verify bias voltages having a maximum verify bias voltage, and performing a second plurality of verify operations on the memory array after the first plurality of verify operations.

17. A memory module comprising:
a non-volatile memory device comprising:
a memory array comprising a plurality of non-volatile memory cells organized in rows and columns wherein each row of cells is coupled to a different word line; and
control circuitry coupled to the memory array and adapted to control operation of the memory device, the control circuitry adapted to program the memory array by performing a first plurality of verify operations on the memory array wherein each verify operation of the first plurality of verify operations comprises a verify bias voltage that is greater than a previous verify bias voltage of the first plurality of verify operations, the plurality of verify bias voltages having a maximum verify bias voltage, and performing a second plurality of verify operations on the memory array after the first plurality of verify operations; and
a plurality of contacts configured to provide selective contact between the memory device and a host system.

18. The module of claim 17 and further including memory controller coupled to the memory device for controlling operation of the memory device in response to the host system.

19. The module of claim 17 wherein the plurality of non-volatile memory cells are flash memory cells.

20. A method for programming a NAND flash memory array having a plurality of memory cells arranged in columns and rows, each row coupled by a different word line of a plurality of word lines such that a first word line is closest to a source line and a last word line is closest to a drain line, the method comprising:
performing an initial program/verify operation on each of the plurality of word lines starting at the first word line and incrementing through the plurality of word lines to the last word line, wherein a first program/verify operation biases the first word line with an initial verify voltage after a program pulse and each subsequent word line is biased with incrementally increasing verify voltages after respective programming pulses up to a maximum verify voltage on the last word line;
performing a read operation on each of the plurality of word lines to obtain read data from each programmed memory cell;
performing a verify operation on each of the plurality of word lines using the read data wherein each verify operation biases a word line with a verify voltage that is substantially equal to the maximum verify voltage; and
if any of the plurality of word lines fails the verify operation, performing a subsequent program/verify operation on the failed word line with the verify voltage used on the failed word line in the initial program/verify operation.

21. A method for programming a flash memory array having a plurality of memory cells arranged along word lines and bit lines of a plurality of word lines and bit lines, each word line comprising a series string of an even page and an odd page, each memory cell comprising a floating gate that can interfere with adjacent floating gates along word lines and bit lines, the method comprising:
performing a program/verify operation on each of the plurality of pages starting at a first page and incrementing through the plurality of pages to the last page, wherein each program/verify operation biases a word line with a verify voltage that is incremented from a previous verify voltage by a step voltage until a maximum verify voltage is reached;
performing a read operation on each page to obtain read data; and performing a verify operation on the plurality of pages using the read data wherein each verify operation biases a word line with a voltage substantially equal to the maximum verify voltage.

22. The method of claim 21 wherein the maximum verify voltage for each series string of odd and even pages is substantially the same.

23. The method of claim 21 wherein the maximum verify voltage for each series string of odd and even pages are not equal.

24. The method of claim 21 wherein the memory cells are multiple level cells and the read operation comprises reading multiple bit read data.

25. The method of claim 21 wherein the step voltage is determined in response to a string resistance of a page.

26. The method of claim 21 wherein the step voltage is determined in response to the floating gate interference.

27. The method of claim 21 the step voltage is different for each word line.

28. The method of claim 21 wherein the step voltage is the same only for a predetermined quantity of adjacent word lines.

29. The method of claim 21 wherein the plurality of word lines comprise a first word line closest to a source line of the array and a last word line closest to a drain line of the array, the method further comprising not performing the verify operation on the last word line.

\* \* \* \* \*